(12) United States Patent
Kimura

(10) Patent No.: US 10,830,825 B2
(45) Date of Patent: Nov. 10, 2020

(54) BATTERY SENSOR DEVICE

(71) Applicant: Panasonic Intellectual Property Management Co., Ltd., Osaka (JP)

(72) Inventor: Shinya Kimura, Tokyo (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 112 days.

(21) Appl. No.: 16/042,519

(22) Filed: Jul. 23, 2018

(65) Prior Publication Data
US 2018/0328996 A1 Nov. 15, 2018

Related U.S. Application Data

(63) Continuation of application No. PCT/JP2017/001303, filed on Jan. 17, 2017.

(30) Foreign Application Priority Data

Feb. 1, 2016 (JP) .................................. 2016-017423

(51) Int. Cl.
| | |
|---|---|
| *G01R 31/3842* | (2019.01) |
| *G01R 31/364* | (2019.01) |
| *H01R 11/28* | (2006.01) |
| *H01R 13/66* | (2006.01) |
| *H01M 10/48* | (2006.01) |
| *H01M 2/30* | (2006.01) |
| *G01R 1/20* | (2006.01) |

(52) U.S. Cl.
CPC ....... *G01R 31/3842* (2019.01); *G01R 31/364* (2019.01); *H01M 2/305* (2013.01); *H01M 10/48* (2013.01); *H01R 11/287* (2013.01); *H01R 13/6683* (2013.01); *G01R 1/203* (2013.01); *H01M 2200/108* (2013.01)

(58) Field of Classification Search
CPC ..................................................... H01R 11/287
See application file for complete search history.

(56) References Cited

U.S. PATENT DOCUMENTS

| | | | |
|---|---|---|---|
| 10,222,397 B2 * | 3/2019 | Salo, III ................... | G01R 1/04 |
| 2007/0046261 A1 * | 3/2007 | Porebski ............ | G01R 31/3648 |
| | | | 320/132 |
| 2012/0041697 A1 * | 2/2012 | Stukenberg .......... | G01R 31/388 |
| | | | 702/63 |

(Continued)

FOREIGN PATENT DOCUMENTS

JP 2015-109236 A 6/2015

OTHER PUBLICATIONS

International Search Report of PCT application No. PCT/JP2017/001303 dated Apr. 18, 2017.

*Primary Examiner* — Christopher E Mahoney
(74) *Attorney, Agent, or Firm* — Seed IP Law Group LLP

(57) ABSTRACT

A battery sensor device includes: a bus bar having a resistor and disposed in a power supply path from a battery; a sensor substrate configured to detect current flowing through the resistor; an output end configured to externally output a signal based on current detected by the sensor substrate; and a battery terminal unit configured to electrically couple the bus bar and the battery. A sensor unit including the bus bar and the output end is separate from the battery terminal unit. The sensor unit has a structure capable of being fixed onto the battery terminal unit in two modes in a reverse relation in a plane.

15 Claims, 13 Drawing Sheets

(56) References Cited

U.S. PATENT DOCUMENTS

2013/0040177 A1\* 2/2013 Hashio ................ H01M 2/305
429/93
2018/0180681 A1\* 6/2018 Tanaka ................ H01M 10/48

\* cited by examiner

BATTERY SENSOR DEVICE

CROSS-REFERENCE TO RELATED APPLICATIONS

This application is a continuation of the PCT International Application No. PCT/JP2017/001303 filed on Jan. 17, 2017, which claims the benefit of foreign priority of Japanese patent application No. 2016-017423 filed on Feb. 1, 2016, the contents all of which are incorporated herein by reference.

BACKGROUND

1. Technical Field

The present disclosure relates to battery sensor devices for detecting a state of a battery

2. Description of the Related Art

A known battery sensor device is attached to a battery (e.g., lead battery) mounted in a vehicle, and is used for detecting a state of charge (SOC) and a state of battery deterioration (residual capacity SOH: State of Health) (e.g., PTL1). Such a battery sensor device is disclosed in Japanese Patent Unexamined Publication No. 2015-109236 (hereinafter referred as PTL1). Battery information (SOC, SOH, etc.) output from the battery sensor device is extremely useful for managing power supply in the vehicle.

The battery sensor device of PTL1 includes a battery terminal unit (hereinafter referred to as a "terminal") to be electrically and mechanically coupled to a negative terminal of a battery, a load terminal unit (hereinafter referred to as a "stud bolt unit") to be electrically coupled to a negative terminal of a load (a frame ground of a vehicle), and a sensor unit for detecting a state of the battery based on current flowing between the terminal and the stud bolt unit. In PTL1, the sensor unit and a terminal unit including the terminal and the stud bolt unit are separate components. There are also battery sensor devices configured with separate components for the terminal, stud bolt unit, and sensor unit.

In these battery sensor devices, a flexibility in changing the position (direction) of an output end (a connecting terminal for outputting battery information) due to various reasons, such as a battery mounting position in a vehicle, is occasionally demanded.

SUMMARY

A battery sensor device of one aspect of the present disclosure detects a state of a battery supplying power to a load. The battery sensor device includes: a bus bar having a resistor and disposed in a power supply path from the battery; a sensor substrate configured to detect current flowing through the resistor; an output end configured to externally output a signal based on the current detected by the sensor substrate; and a battery terminal unit configured to electrically couple the bus bar and the battery. A sensor unit including the bus bar and the output end is separate from the battery terminal unit, and has a structure that can be fixed onto the battery terminal unit in two modes in which a position of the sensor unit is reversed in a plane.

According to the present disclosure, only the direction of the sensor unit can be reversed while keeping the battery terminal unit at a fixed position when attaching the sensor unit to the battery. In other words, a common sensor unit can be used for two specifications with different positions for the output end. Accordingly, the rate of use of common components can be increased, allowing further cost reduction.

DETAILED DESCRIPTION OF PREFERRED EMBODIMENTS

Prior to describing exemplary embodiments of the present disclosure, problems in the device of the related art are described briefly. To support any change in a position of the output end, components (sensor unit, etc.) for various respective positions may be prepared. However, the rate of use of common components is low and therefore cost increases if the components for the various respective positions are prepared An object of the present disclosure is to offer a battery sensor device that can further reduce cost by increasing the rate of use of common components.

An exemplary embodiment of the present disclosure is detailed below with reference to drawings.

Figure 1A:
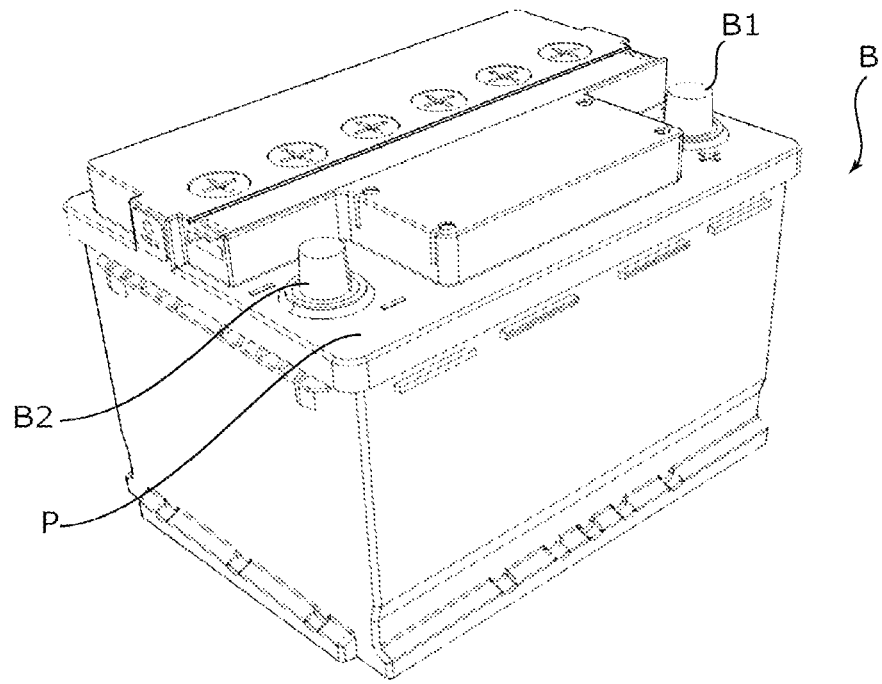
FIG. 1A is a perspective view of an appearance of a battery to be mounted in a vehicle in a state before a battery sensor device is attached.
Figure 1B:
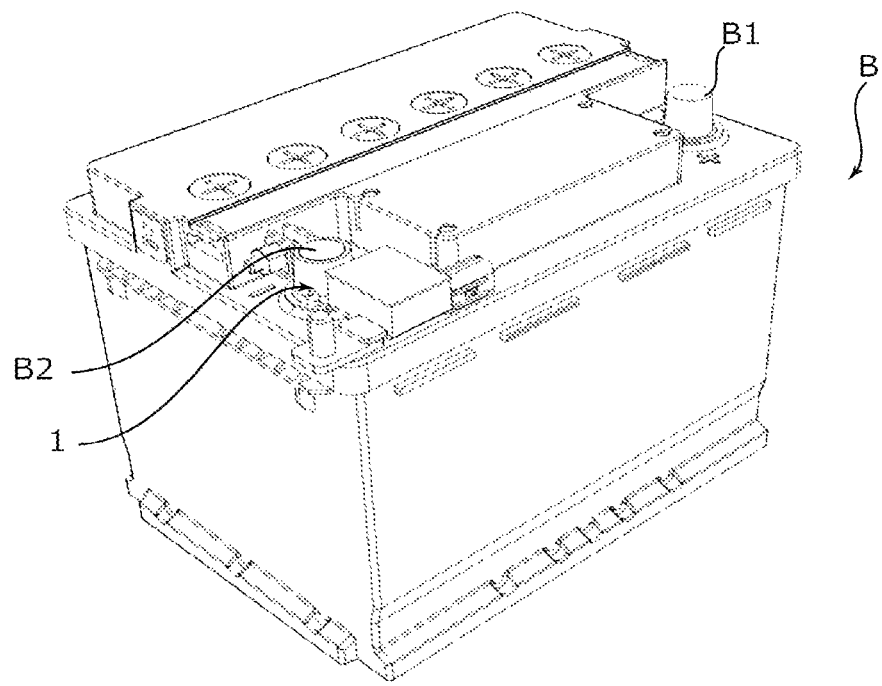
FIG. 1B is a perspective view of an appearance of the battery to be mounted in the vehicle in a state after the battery sensor device is attached.

FIG. 1A is a perspective view of an appearance of battery B to be mounted in a vehicle in a state before attaching battery sensor device 1 in the exemplary embodiment of the present disclosure. FIG. 1B shows the state after battery sensor device 1 is attached. In FIG. 1B, battery sensor device 1 is attached to battery B in a first attachment mode.

As shown in FIG. 1A and FIG. 1B, battery B has positive terminal B1 and negative terminal B2. Flat portion P around negative terminal B2 is a surface for attaching battery sensor device 1 (hereinafter referred to as "attachment plane P").

Battery sensor device 1 is tightened to negative terminal B2 with nut 23 and bolt 24 (see FIG. 4A and FIG. 4B) after inserting negative terminal B2 into clamp 21 (see FIG. 4A and FIG. 4B) of terminal 20 (battery terminal unit). Battery sensor device 1 detects a battery capacity (SOC: State of Charge) and battery deterioration state (residual capacity, SOH: State of Health) based on current returning from positive terminal Bi to negative terminal B2 of battery B via load (not illustrated), and outputs the state as battery information to CPU (Central Processing Unit, not illustrated) or ECU (Engine Control Unit, not illustrated) installed in the vehicle.

Figure 2A:
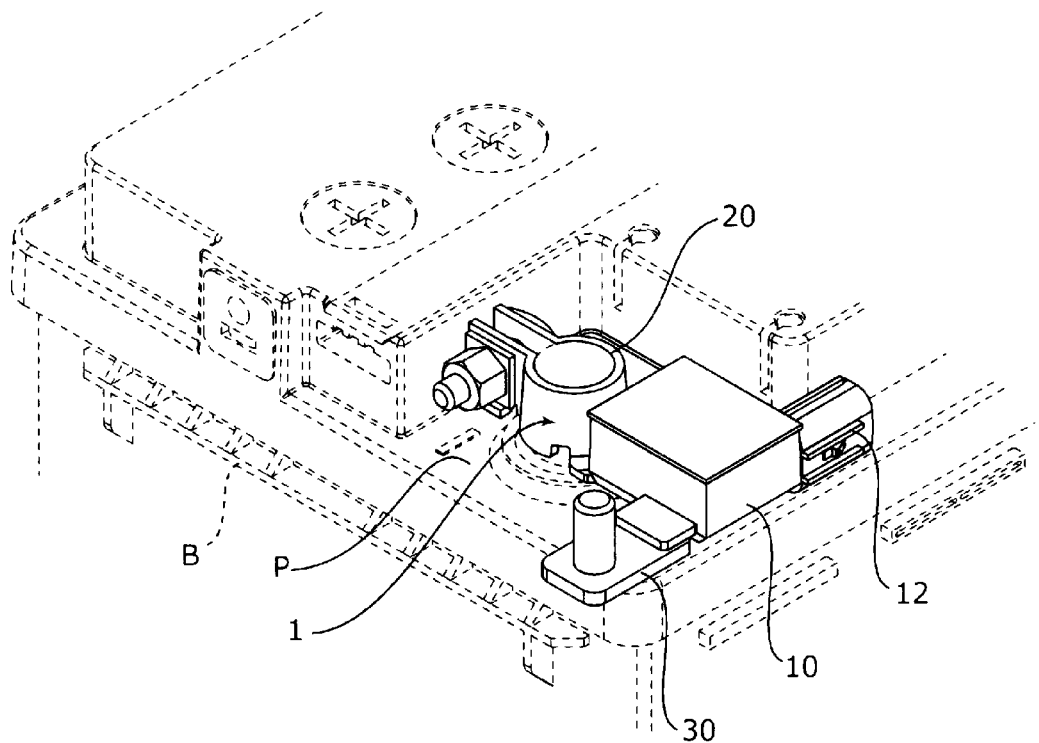
FIG. 2A illustrates a first attachment mode of the battery sensor device in which an output end of the battery sensor device is disposed toward an inner side of the battery.
Figure 2B:
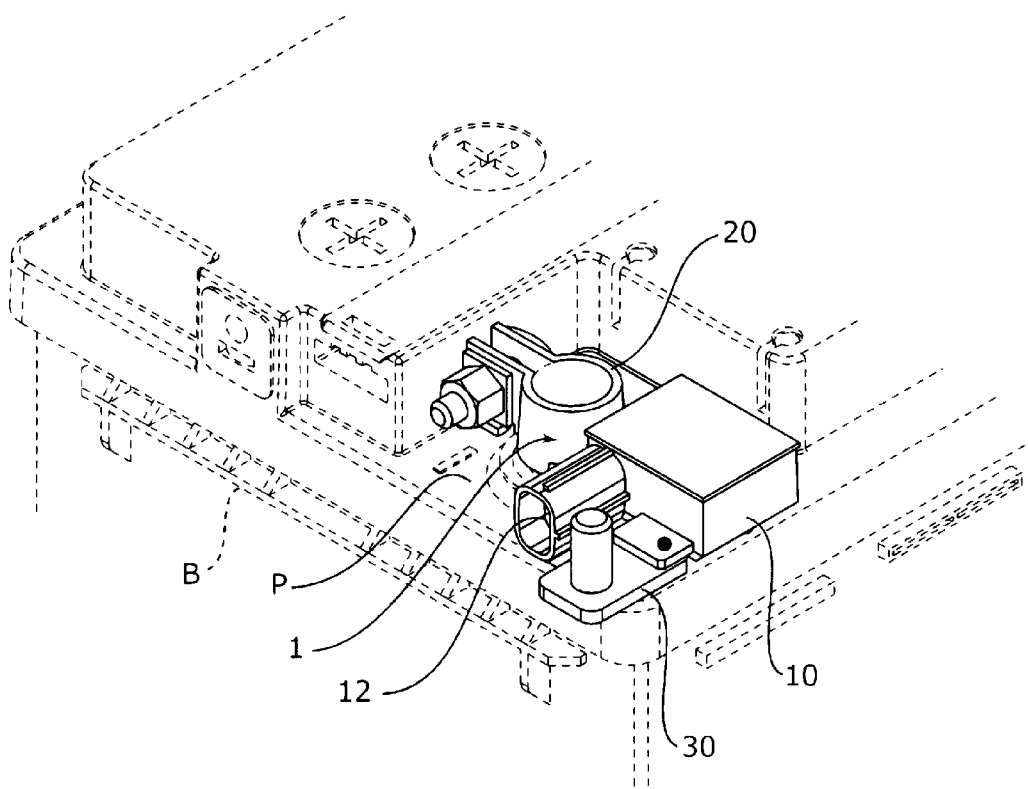
FIG. 2B illustrates a second attachment mode of the battery sensor device in which the output end is disposed toward an outer side of the battery

FIG. 2A shows an attachment mode of battery sensor device I in the exemplary embodiment of the present disclosure. In a first attachment mode, output end 12 of battery sensor device 1 is disposed toward an inner side of battery B. FIG. 2B shows a second attachment mode in which output end 12 is disposed toward an outer side of battery B. To clearly indicate the direction of sensor unit 10, a black dot is marked on a surface of bus bar (first bus bar 111, see FIG. 4A and FIG. 4B) provided side by side with output end 12. Also in FIG. 11, an arrow is indicated to clearly show the direction of sensor substrate 13.

As shown in FIG. 2A and FIG. 2B, battery sensor device 1 can be attached to battery B in two different attachment modes at positions that sensor unit 10 is rotated by 180° in attachment plane P. Positions of terminal 20 and stud bolt unit 30 (load terminal unit) are same in the first attachment mode and the second attachment mode.

Figure 3A:
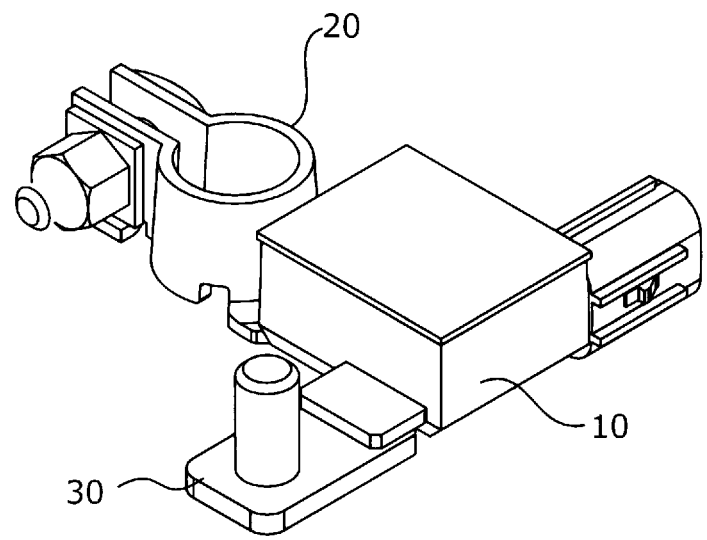
FIG. 3A is a top perspective view illustrating a structure of the battery sensor device in the first attachment mode.
Figure 3B:
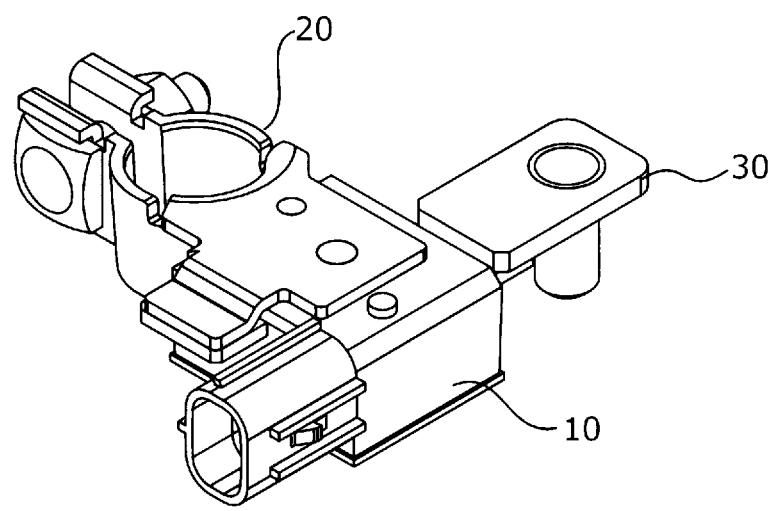
FIG. 3B is a bottom perspective view illustrating the structure of the battery sensor device in the first attachment mode.
Figure 4A:
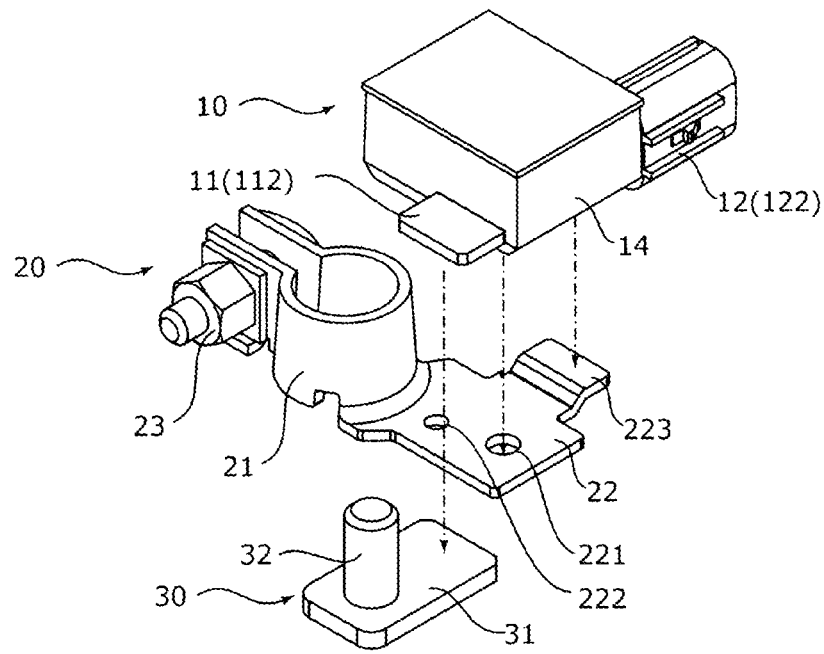
FIG. 4A is a top exploded perspective view illustrating the structure of the battery sensor device in the first attachment mode.
Figure 4B:
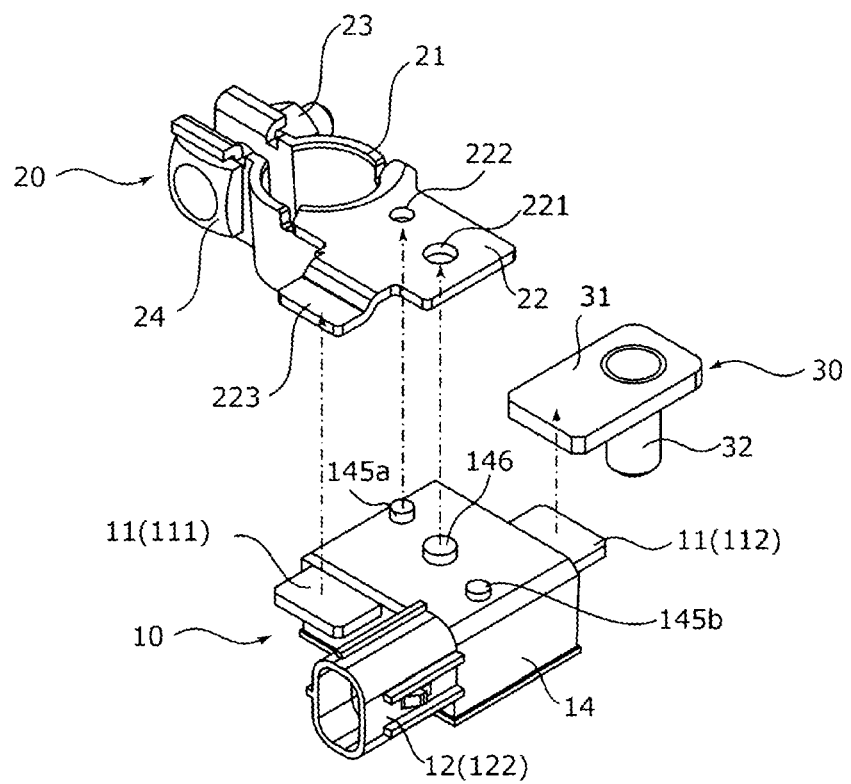
FIG. 4B is a bottom exploded perspective view illustrating the structure of the battery sensor device in the first attachment mode.
Figure 5A:
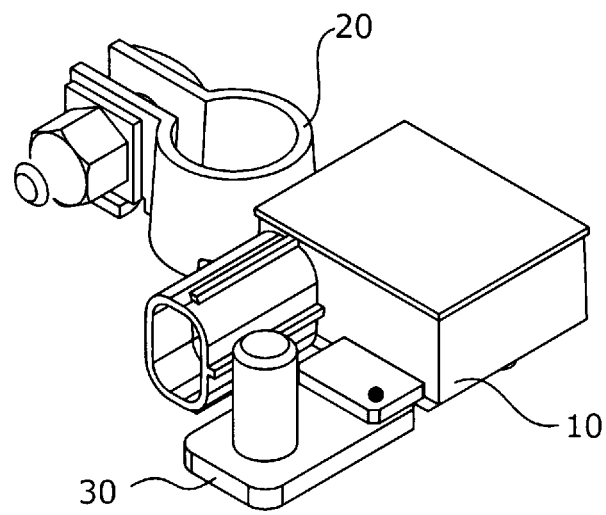
FIG. 5A is a top perspective view illustrating a structure of the battery sensor device in the second attachment mode.
Figure 5B:
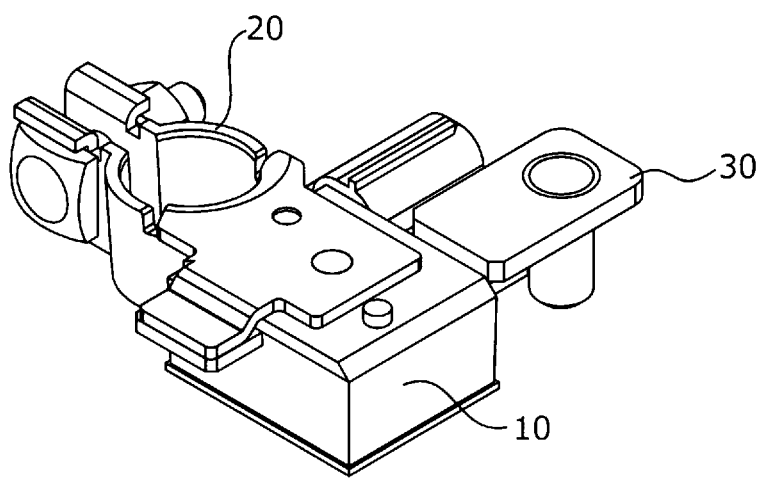
FIG. 5B is a bottom perspective view illustrating the structure of the battery sensor device in the second attachment mode.
Figure 6A:
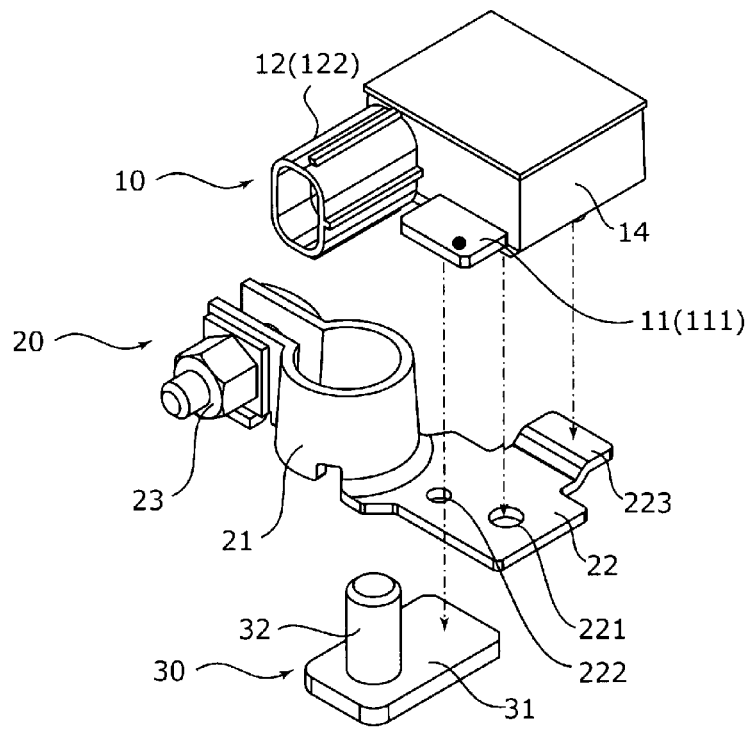
FIG. 6A is a top exploded perspective view illustrating the structure of the battery sensor device in the second attachment mode.

FIG. 3A and FIG. 3B are top and bottom perspective views, respectively, illustrating the structure of battery sensor device 1 in the first attachment mode. FIG. 4A and FIG. 4B are top and bottom exploded perspective views, respectively, illustrating the structure of battery sensor device 1 in the first attachment mode. FIG. 5A and FIG. 5B are top and bottom perspective views, respectively, illustrating the structure of battery sensor device 1 in the second attachment mode. FIG. 6A and FIG. GB are top and bottom exploded perspective views, respectively, illustrating the structure of battery sensor device 1 in the second attachment mode.

As shown in FIG. 3A to FIG. 6B, battery sensor device 1 includes sensor unit 10, terminal 20, stud bolt unit 30, and sensor substrate 13. Sensor unit 10, terminal 20, and stud bolt unit 30 are independent of each other.

Terminal 20 electrically couples negative terminal B2 of battery B and bus bar with resistance 11 of sensor unit 10. Terminal 20 is typically formed of a metal material, such as copper and brass. Terminal 20 includes clamp 21 and sensor unit attachment part 22. Negative terminal B2 of battery B is inserted through clamp 21 when attaching battery sensor device 1 to battery B. Terminal 20 is fixed onto negative terminal B2 of battery B by tightening clamp 21 with bolt 24 and nut 23.

Sensor unit attachment part 22 protrudes in a planar manner from a lower peripheral edge of clamp 21. Sensor unit attachment part 22 is provided with fixing holes 221 and 222 for securing sensor unit 10. Sensor unit attachment part 22 is connected to bus bar with resistance 11 of sensor unit 10 at bus bar connecting part 223.

Stud bolt unit 30 electrically couples a negative terminal (not illustrated) of the load and bus bar with resistance 11 of sensor unit 10. Stud bolt unit 30 is formed of a metal material, such as copper and brass, same as terminal 20. Stud bolt unit 30 includes bus bar connecting part 31 and stud bolt 32. Stud bolt 32 is erected on bus bar connecting part 31, and is electrically coupled to the negative terminal of the load connected to a frame ground of the vehicle, i.e., battery B, via a wire harness (not illustrated). Bus bar connecting part 31 is connected to bus bar with resistance 11 of sensor unit 10.

Sensor unit 10 includes bus bar with resistance 11 and output end 12, and has a structure attachable to terminal 20 and stud bolt unit 30 in one of the first attachment mode and the second attachment mode which are in a relation rotated by 180° in a plane.

Figure 7:
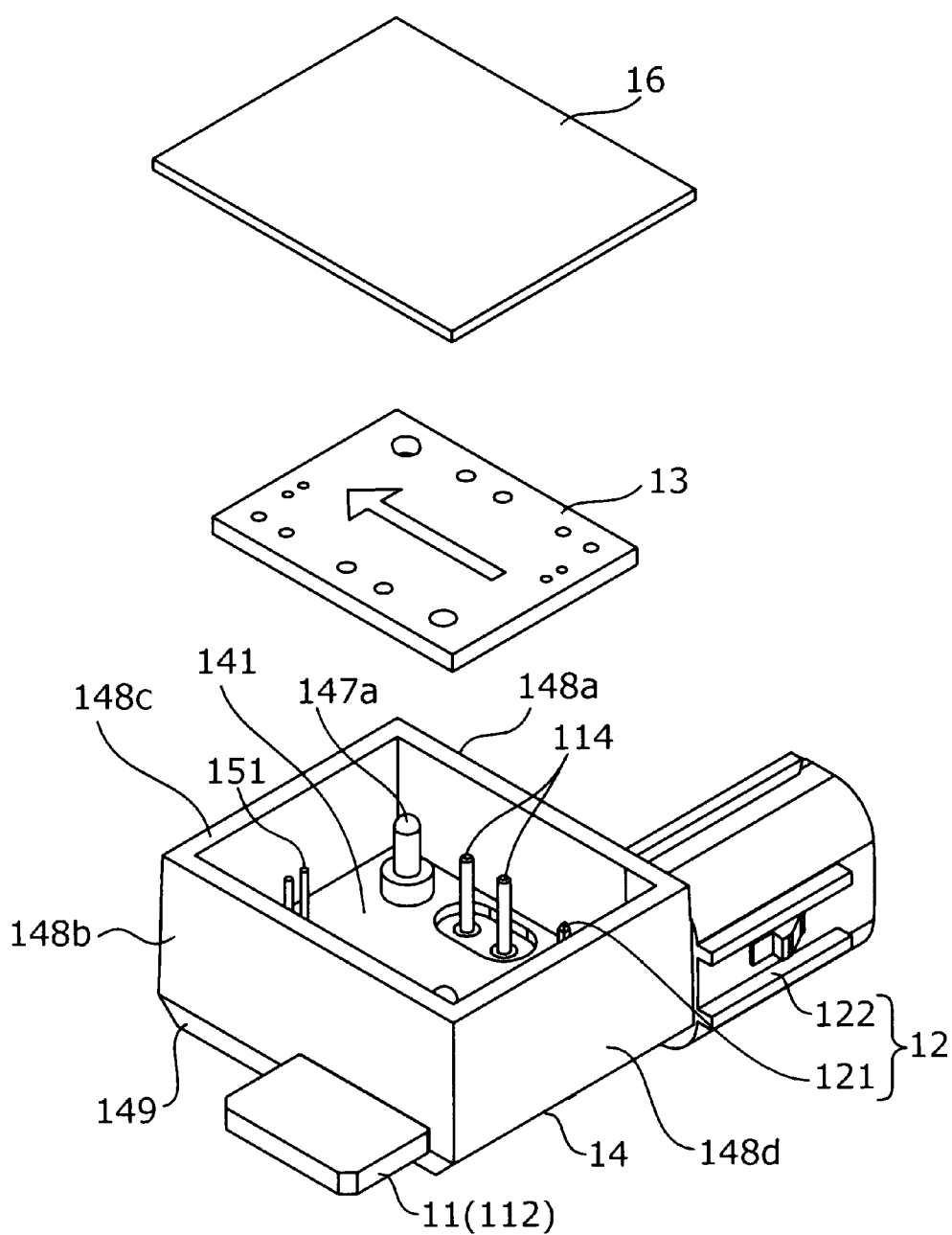
FIG. 7 is an exploded perspective view illustrating the structure of a sensor unit in the first attachment mode.
Figure 8A:
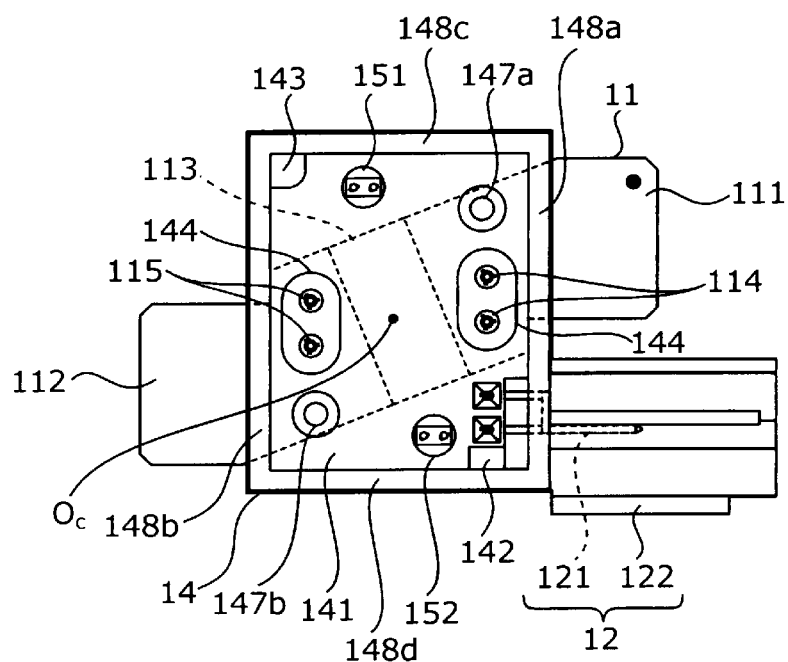
FIG. 8A is a plan view showing the structure of the sensor unit in the first attachment mode.
Figure 8B:
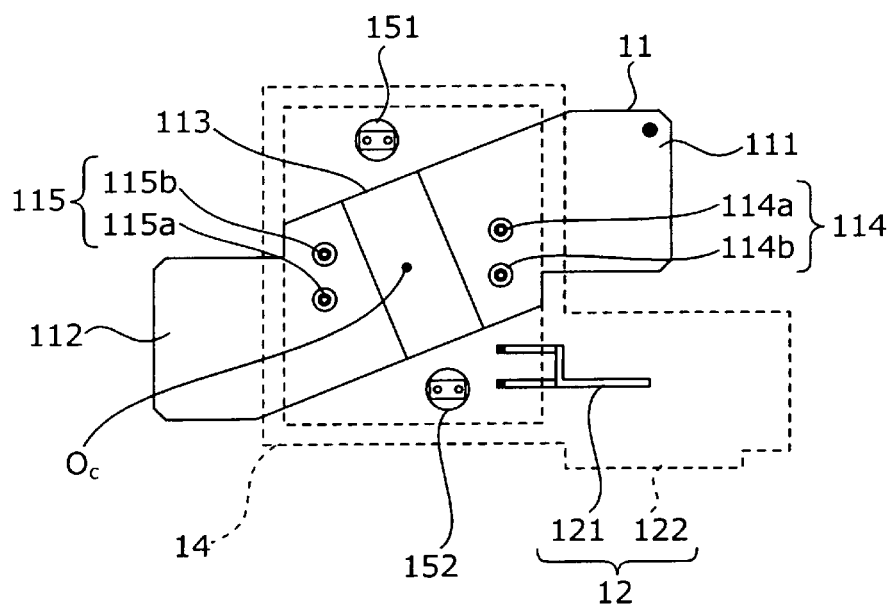
FIG. 8B is a plan view in a state seeing through a casing and a connector jacket in FIG. 8A.
Figure 9:
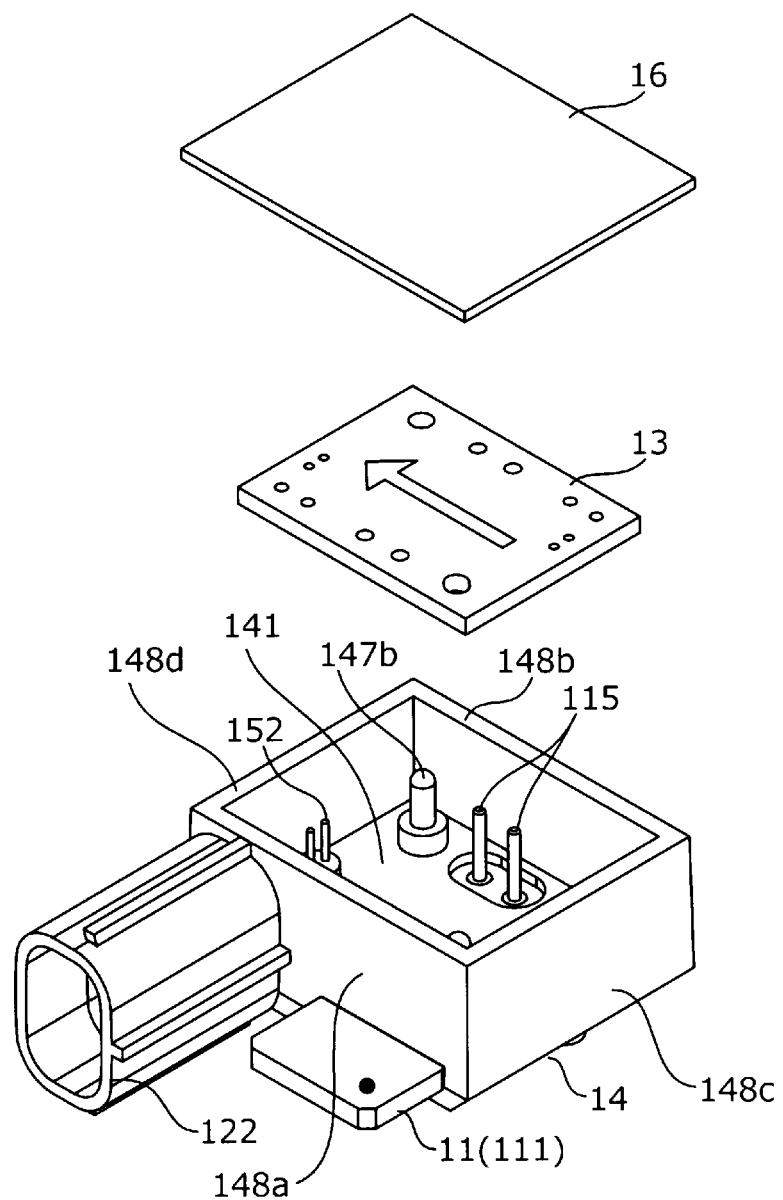
FIG. 9 is an exploded perspective view showing the structure of the sensor unit in the second attachment mode.
Figure 10A:
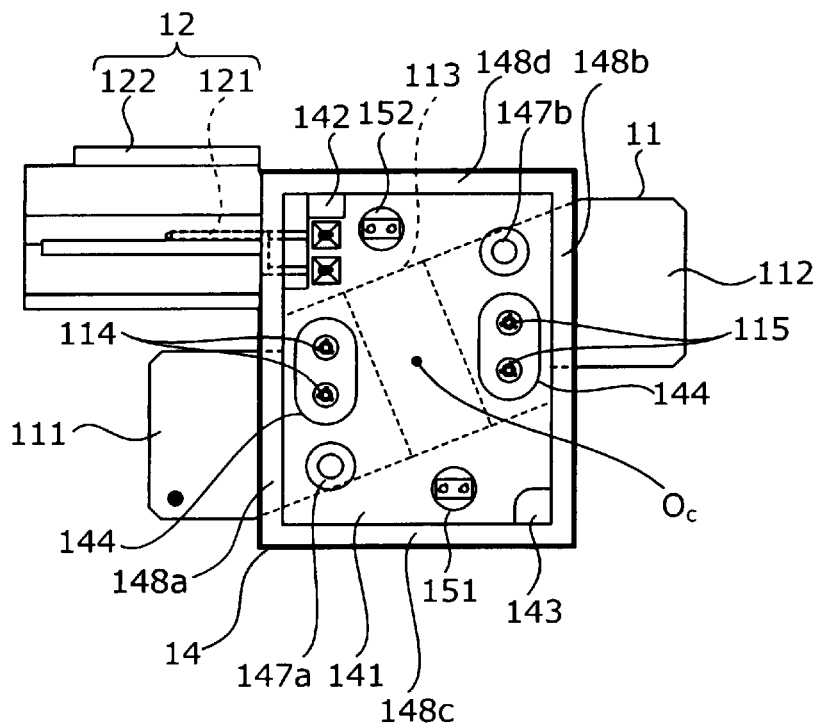
FIG. 10A is a plan view showing the structure of the sensor unit in the second attachment mode.
Figure 10B:
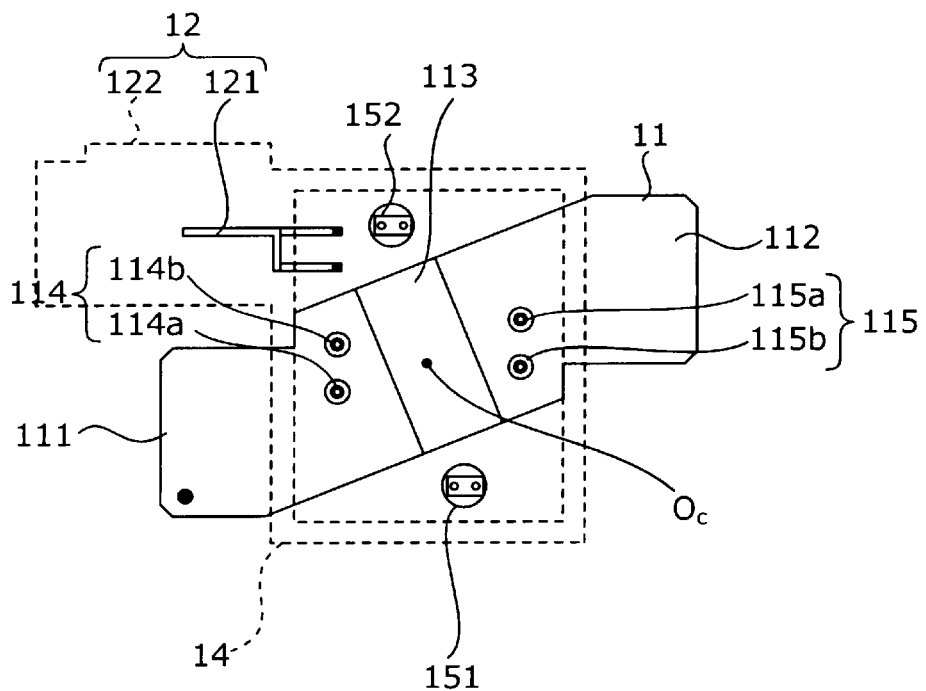
FIG. 10B is a plan view in a state seeing through the casing and the connector jacket in FIG. 10A.
Figure 11:
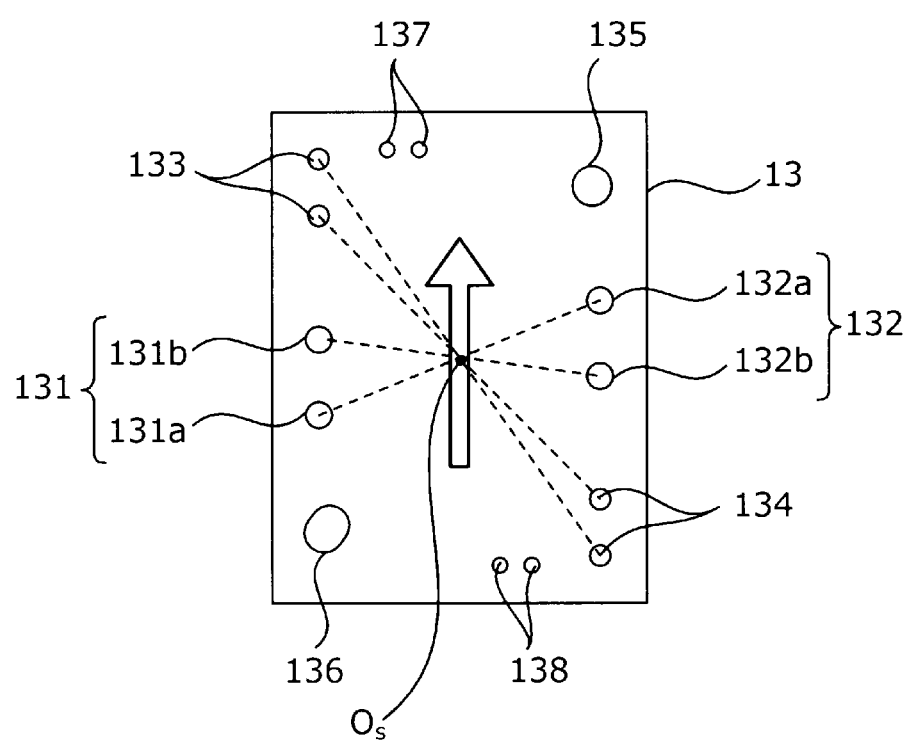
FIG. 11 is a plan view of a sensor substrate.

FIG. 7 is an exploded perspective view of sensor unit 10 in the first attachment mode. FIG. 8A and FIG. 8B are plan views of sensor unit 10 in the first attachment mode. FIG. 9 is an exploded perspective view of sensor unit 10 in the second attachment mode. FIG. 10A and FIG. 10B are plan views of sensor unit 10 in the second attachment mode. FIG. 11 is a plan view of sensor substrate 13.

FIG. 8A, FIG. 8B, FIG. 10A, and FIG. 10B show the state in which sensor substrate 13 and cover 16 are removed. Still more, FIG. 8B and FIG. 10B show the state seeing through casing 14 and connector jacket 122.

As shown in FIG. 7 to FIG. 10B, sensor unit 10 includes bus bar with resistance 11, output end 12, casing 14, and thermistors 151 and 152. Sensor substrate 13 is disposed inside sensor unit 10.

Casing 14 is a rectangular box in a planar view, including side walls 148a to 148d and bottom wall 149, and accommodates sensor substrate 13 inside its cavity. In a description below, side wall 148a is indicated as first side wall 148a, side wall 148b opposing first side wall 148a is indicated as second side wall 148b; side walls 148c and 148d other than first side wall 148a and second side wall 148b are indicated as third side walls 148c and 148d.

Casing 14 has intermediate floor 141 for holding bus bar with resistance 11, together with bottom wall 149 therebetween. On intermediate floor 141, two positioning pins 147a and 147b are provided. Positioning pins 147a and 147b are point-symmetrical in the plane with respect to center Oc of casing 14. Positioning pins 147a and 147b are inserted into positioning holes 135 and 136 in sensor substrate 13, respectively.

Steps 142 and 143 are also provided on intermediate floor 141 at a position near a protruding part of connector pin 121 and a position diagonal thereto, respectively. Sensor substrate 13 is placed on steps 142 and 143. This structure results in creating a space between sensor substrate 13 and intermediate floor 141. The cavity of casing 14 is sealed with cover 16.

Figure 6B:
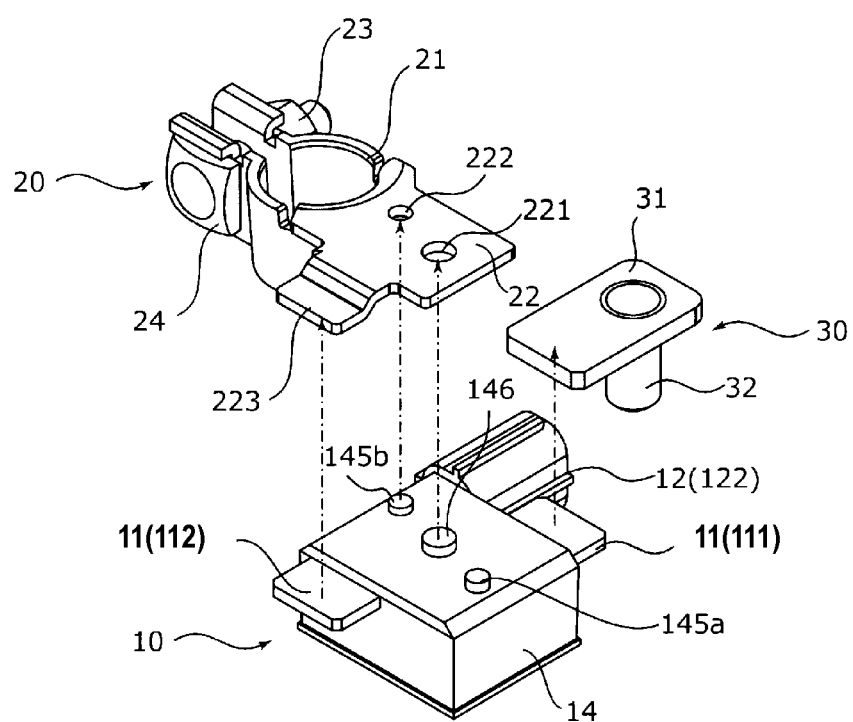
FIG. 6B is a bottom exploded perspective view illustrating the structure of the battery sensor device in the second attachment mode.

Casing 14 has fixing bosses 145a, 145b, and 146 on its bottom for being fixed to terminal 20 (see FIG. 4B and FIG. 6B). Fixing boss 146 is disposed at center Oc of casing 14 (an intersection point of diagonal lines of casing 14 in a planar view). Fixing bosses 145a and 145b are point-symmetrical with respect to fixing boss 146. Accordingly, terminal 20 can be engaged, at fixing holes 221 and 222, with fixing bosses 145a and 146 in the first attachment mode and with fixing bosses 145b and 146 in the second attachment mode.

Casing 14 may only have fixing boss 146, or only fixing bosses 145a and 145b. Still more, terminal 20 may be provided with three fixing holes that engage with fixing bosses 145a, 145b, and 146, respectively. In other words, the fixing bosses that engage with terminal 20 at the fixing holes respectively may be point-symmetrical n in the plane with respect to center Oc of casing 14.

Bus bar with resistance 11 includes first bus bar 111, shunt resistor 113, and second bus bar 112. First bus bar 111 and second bus bar 112 are plate members formed of metal, such as copper. Bus bar with resistance 11 is disposed in a power supply path of battery B. Shunt resistor 113 is disposed between first bus bar 111 and second bus bar 112 in an energizing direction.

Bus bar with resistance 11 has a point-symmetric shape in the plane as a whole. However, as long as portions protruding from casing 14 have a point-symmetric shape, a detailed structure, such as a layout of shunt resistor 113, may be asymmetric.

In first bus bar 111, first current-detecting pins 114 (114a and 114b) are erected near shunt resistor 113. In second bus bar 112, second current-detecting pins 115 (115a and 115b) are erected near shunt resistor 113. First current-detecting pins 114 and second current-detecting pins 115 are point-symmetrical in the plane with respect to center Oc of casing 14 in the state that bus bar with resistance 11 is installed in casing 14.

Bus bar with resistance 11 is integrally formed with casing 14, typically by insert-molding. Bus bar with resistance 11 is interposed between bottom wall 149 and intermediate floor 141 of casing 14, and first current-detecting pins 114 and second current-detecting pins 115 protrude from openings 144 in intermediate floor 141 toward sensor substrate 13. First bus bar 111 protrudes from first side wall 148a of casing 14, and second bus bar 112 protrudes from second side wall 148b of casing 14.

Bus bar with resistance 11 is disposed in such a manner that a portion of first bus bar 111 protruding from casing 14 (hereinafter referred to as a "first end") and a portion of second bus bar 112 protruding from casing 14 (hereinafter referred to as a "second end") are point-symmetrical in the plane with respect to center Oc of casing 14. In other words, the first end and the second end of bus bar with resistance 11 are point symmetrical in the plane with respect to center Oc of casing 14.

Output end 12 is a connecting terminal for outputting battery information generated by sensor substrate 13 to CPU or ECU (not illustrated) installed in the vehicle. Output end 12 is disposed at a position that does not interfere with clamp 21 of terminal 20 in both first attachment mode and second attachment mode. Herein, output end 12 is disposed on first side wall 148a of casing 14 together with the first end of bus bar with resistance 11.

Output end 12 includes connector pin 121 and connector jacket 122. Connector pin 121 is integrally formed with casing 14 and connector jacket 122, typically by insert-molding. Connector jacket 122 is provided on first side wall 148a of casing 14, integrally with first side wall 148a. Casing 14 and connector jacket 122 are integrally formed, typically by resin molding.

When sensor unit 10 is rotated by 180° in the plane, portions other than output end 12 of sensor unit 10 remain the same in the first attachment mode and the second attachment mode. Accordingly, common sensor unit 10 can be used for attaching battery sensor device 1 to battery B in the first attachment mode and in the second attachment mode.

The first end and the second end of bus bar with resistance 11 are preferably disposed to different positions with respect to a center line that is parallel to third side walls 148c and 148d and divides casing 14 into two parts. Still more, output end 12 is preferably disposed inside a quadrilateral of which diagonal vertexes are the first end and the second end of bus bar with resistance 11 in a planar view. Output end 12 may be partially disposed inside the quadrilateral, namely, it is not necessary that entire output end 12 is disposed inside the quadrilateral.

In the exemplary embodiment, bus bar with resistance 11 has a gently cranked structure in the plane, and the first end and the second end of bus bar with resistance 11 are disposed at the aforementioned positions. Output end 12 is disposed on first side wall 14a of casing 14, together with the first end of bus bar with resistance 11 at the aforementioned position.

This layout can shorten the length of first side wall 148a and second side wall 148b of casing 14, compared to a layout of disposing linear bus bar with resistance 11 along the center line of casing 14. Accordingly, sensor unit 10 can be downsized, and therefore battery sensor device 1 can be downsized.

Thermistors 151 and 152 detect an ambient temperature of bus bar with resistance 11. Thermistors 151 and 152 are integrally formed with casing 14, typically by insert-molding. Thermistors 151 and 152 are point-symmetrical in the plane with respect to center Oc of casing 14.

Sensor substrate 13 detects current flowing through, for example, shunt resistor 113, i.e., current flowing between terminal 20 and stud bolt unit 30. Based on detected current and temperature information from thermistors 151 and 152, sensor substrate 13 generates battery information (SOC, SOH, etc.). Sensor substrate 13 may directly output a current value and temperature information to outside via output end 12.

Sensor substrate 13 is a rectangular substrate slightly smaller than casing 14, and includes a circuit for detecting the battery state. As shown in FIG. 11, sensor substrate 13 includes current-detecting connection holes 131 and 132, connector connection holes 133 and 134, positioning holes 135 and 136, and thermistor connection holes 137 and 138. Current-detecting connection holes 131 and 132 are point-symmetrical in the plane with respect to center Os of sensor substrate 13 (matched with center Oc of casing 14 when sensor substrate 13 is housed in casing 14). In the same manner, connector connection holes 133 and 134 are point-symmetrical, positioning holes 135 and 136 are point-symmetrical, and thermistor connection holes 137 and 138 are point-symmetrical.

To detect current flowing through shunt resistor 113, sensor substrate 13 is connected, at current-detecting connection holes 131 (131a and 131b), to load current-detecting pins 114 (114a and 114b) or 115 (115a and 115b), i.e., current-detecting pins 114 or 115 electrically coupled to stud bolt unit 30. To detect current flowing through shunt resistor 113, sensor substrate 13 is connected, at current-detecting connection holes 132 (132a and 132b), to battery current-detecting pins 114 (114a and 114b) or 115 (115a and 115b), i.e., current-detecting pins 114 or 115 electrically coupled to terminal 20.

Based on a difference in potential between current-detecting connection holes 131a and 132a, sensor substrate 13 detects current flowing through shunt resistor 113. Current-detecting connection hole 131b is a dummy hole not connected to a wiring pattern. The conductor at current-detecting connection hole 132b is connected to a reference potential point of the circuit. The conductors at connector connection holes 133 and 134 are conductive to each other, and connector pin 121 is connected to the conductor at either connector connection holes 133 or 134.

Positioning pins 147a and 147b are inserted into positioning holes 135 and 136. More specifically, in the first attachment mode, positioning pins 147a and 147b are inserted into positioning holes 135 and 136, respectively. In the second attachment mode, positioning pins 147b and 147a are inserted into positioning holes 135 and 136, respectively As shown in FIG. 3A, FIG. 3B, FIG. 4A, and FIG. 4B, to attach battery sensor device 1 to battery B in the first attachment mode, fixing boss 146 of casing 14 is engaged with terminal 20 at fixing hole 221 of, and fixing boss 145a is engaged with terminal 20 at fixing hole 222. Fixing boss 146 and a part at fixing hole 221, and fixing boss 145a and a part at fixing hole 222 are fixed, respectively, typically by thermal caulking. Still more, in the first attachment mode, bus bar connecting part 223 of terminal 20 and first bus bar 111 of bus bar with resistance 11 are bonded, typically by welding, and bus bar connecting part 31 of stud bolt unit 30 and second bus bar 112 of bus bar with resistance 11 are bonded, typically by welding. Clamp 21 of terminal 20 is adjacent to third side wall 148c of casing 14 of sensor unit 10.

Then, sensor substrate 13 is inserted into casing 14, second current-detecting pins 115a and 115b are connected to sensor substrate 13 at current-detecting connection holes 131a and 131b, and first current-detecting pins 114a and 114b are connected to sensor substrate 13 at current-detecting connection holes 132a and 132b. Sensor substrate 13 detects current flowing through shunt resistor 113 based on a difference in potential between current-detecting connection holes 131a and 132a, i.e., a difference in potential between second current-detecting pin 115a and first current-detecting pin 114a. In this case, current-detecting connection hole 132b (first current-detecting pin 114b) is connected to the reference potential point of the circuit, and current-detecting connection hole 131b (second current-detecting pin 115b) is not used. A detection result of sensor substrate 13 is output via connector pin 121 connected to sensor substrate 13 at connector connection hole 134.

As shown in FIG. 5A, FIG. 5B, FIG. 6A, and FIG. 6B, to attach battery sensor device 1 to battery B in the second attachment mode, fixing boss 146 engages with terminal 20 at fixing hole 221, and fixing boss 145b engages with terminal 20 at fixing hole 222. Fixing boss 146 engages with terminal 20 at fixing hole 221 in, and fixing boss 145b engages with terminal 20 at fixing hole 222. Fixing boss 146 and a part at fixing hole 221, and fixing boss 145b and a part at fixing hole 222 are fixed, respectively, typically by thermal caulking. Also in the second attachment mode, bus bar connecting part 223 of terminal 20 and second bus bar 112 of bus bar with resistance 11 are bonded, typically by welding, and bus bar connecting part 31 of stud bolt unit 30 and first bus bar 111 of bus bar with resistance 11 are bonded, typically by welding. Clamp 21 of terminal 20 adjacent to third side wall 148d of casing 14 of sensor unit 10.

Then, sensor substrate 13 is inserted into casing 14, and first current-detecting pins 114a and 114b are connected to sensor substrate 13 at current-detecting connection holes 131a and 131b, and second current-detecting pins 115a and 115b are connected to sensor substrate 13 at current-detecting connection holes 132a and 132b. Sensor substrate 13 detects current flowing through shunt resistor 113 based on a difference in potential between current-detecting connection holes 131a and 132a, i.e., a difference in potential between second current-detecting pin 114a and first current-detecting pin 115a. In this case, current-detecting connection hole 132b (first current-detecting pin 115b) is connected to the reference potential point of the circuit, and current-detecting connection hole 131b (second current-detecting pin 114b) is not used. A detection result of sensor substrate 13 is output via connector pin 121 connected to sensor substrate 13 at connector connection hole 133.

As described above, battery sensor device 1 includes: bus bar with resistance 11 having shunt resistor 113 and disposed in a power supply path from battery B; sensor substrate 13 for detecting current flowing through shunt resistor 113; output end 12 for externally outputting a signal based on the current detected by sensor substrate 13; and terminal 20 (battery terminal unit) for electrically coupling bus bar with resistance 11 and battery B. Sensor unit 10 including bus bar with resistance 11 and output end 12 is a component separate from terminal 20 and can be fixed onto terminal 20 in the first attachment mode and the second attachment mode that are in a reverse relation in the plane.

Specifically, the first end and the second end of bus bar with resistance 11 are point-symmetrical in the plane with respect to symmetric point Oc. More specifically, terminal 20 includes: clamp 21 to be connected to negative terminal B2 of battery B; and sensor unit attachment part 22 integrated with clamp 21 and attached to sensor unit 10. Clamp 21 is disposed adjacent to sensor unit 10, and output end 12 is disposed at a position that does not interfere with clamp 21 in both first attachment mode and second attachment mode.

In battery sensor device 1, three components i.e. sensor unit 10, terminal 20, and stud bolt unit 30 are independent of each other. Bus bar with resistance 11 configuring sensor unit 10 is connectable to both terminal 20 and stud bolt unit 30, and thus only the direction of sensor unit 10 can be reversed. In other words, common sensor unit 10 can be used for two different specifications with different positions for output end 12. Accordingly, the rate of use of common components can be increased to further reduce cost.

Still more, the first end and the second end of bus bar with resistance 11 are disposed at different positions with respect to the center line of casing 14. In other words, bus bar with resistance 11 is disposed obliquely with respect to the center line of casing 14. This enables to downsize battery sensor device 1.

Furthermore, sensor substrate 13 has a point-symmetric structure in the plane with respect to center Os of sensor substrate 13. On the other hand, components connected to sensor substrate 13 (excluding connector pin 121) in components of sensor unit 10 are point-symmetrical in the plane with respect to center Oc of casing 14. Specifically, current-detecting pins 114 and 115 are point-symmetrical, positioning pins 147a and 147b are point-symmetrical, and thermistors 151 and 152 are point-symmetrical. This enables to use common sensor substrate 13 for the first attachment mode and the second attachment mode, and thus cost can be further reduced.

The above specifically describes the present disclosure with reference to the exemplary embodiment. However, the present disclosure is not limited in any way by the above exemplary embodiment, and any modification is applicable within the intention of the present disclosure.

In the exemplary embodiment, positions of terminal 20 and stud bolt unit 30 are fixed, and thus the first attachment mode and the second attachment mode are in a positional relation of 180-degree rotation in the plane. When the position of stud bolt unit 30 is variable, the first attachment mode and the second attachment mode may not have a precise positional relation of 180-degree rotation in the plane. A positional relation of rotation in a degree that can be considered as reversal (e.g., 180°±15°) is acceptable. In other words, sensor unit 10 may at least have a structure that sensor unit 10 is attachable to terminal 20 and stud bolt unit 30 in the first attachment mode and the second attachment mode in a reverse relation to each other.

In the exemplary embodiment, sensor substrate 13 is provided with four current-detecting connection holes 131a, 131b, 132a, and 132b. However, sensor substrate 13 may only be provided with two current-detecting connection holes 131a and 132a.

In the exemplary embodiment, common sensor substrate 13 can be used for the first attachment mode and the second attachment mode. However, separate sensor substrates 13 for supporting the first attachment mode and the second attachment mode are also applicable. In this case, an internal structure (e.g., position of current-detecting pin) of sensor unit 10 does not need to be point-symmetrical in the plane with respect to center Oc of casing 14.

Still more, bus bar with resistance 11 can also be a linear member. In this case, bus bar with resistance 11 is disposed in a way such that it passes center Oc of casing 14. However, this results in larger sensor unit 10, compared to the case of adopting cranked bus bar with resistance 11. Still more, each of current-detecting pins 114 and 115 may be formed with a single pin.

In the above exemplary embodiment, sensor unit attachment part 22 is formed in a flat shape protruding from the lower peripheral edge of clamp 21. In other words, sensor unit attachment part 22 is formed in a vertical direction with respect to an axial direction of clamp 21. However, sensor unit attachment part 22 may be formed in a horizontal direction with respect to the axial direction of clamp 21.

Figure 12:
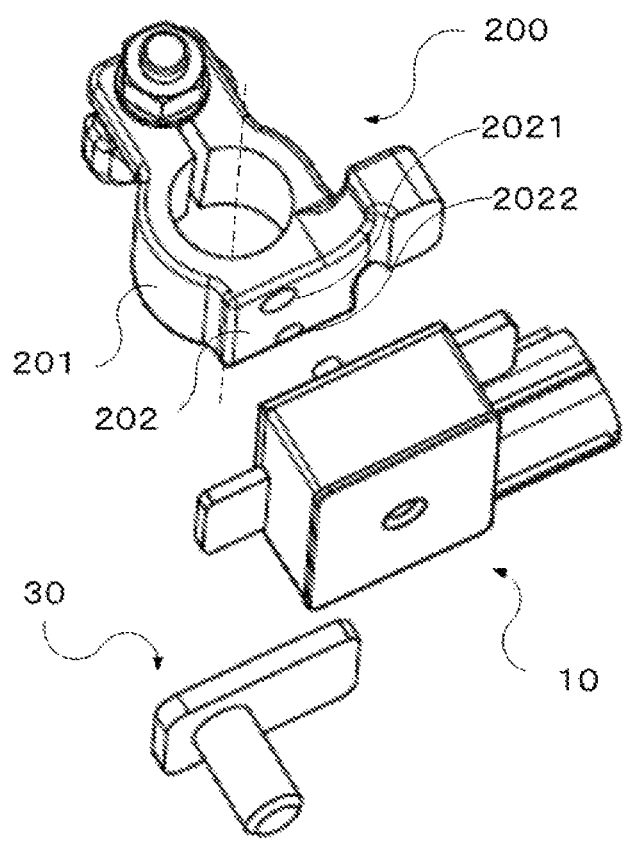
FIG. 12 is an exploded perspective view showing the structure of the battery sensor device in the first attachment mode when a sensor unit attachment part is formed in an axial direction of a clamp.

FIG. 12 is an exploded perspective view illustrating a structure of the battery sensor device when the sensor unit attachment part is formed in the axial direction of the clamp.

In FIG. 12, unlike the structure in the above exemplary embodiment, sensor unit attachment part 202 (attachment plane for sensor unit 10) is formed horizontally with respect to the axial direction of clamp 201 in terminal 200. Sensor unit attachment part 202 is provided with fixing holes 2021 and 2022 for securing sensor unit 10.

Sensor unit 10 is attached to sensor unit attachment part 202 in the same way as that in the above exemplary embodiment. In other words, sensor unit 10 can be attached in two different attachment modes in which sensor unit 10 is rotated by 180° in sensor unit attachment part 202 (attachment plane of sensor unit 10) with each other, same as the above exemplary embodiment.

Figure 13:
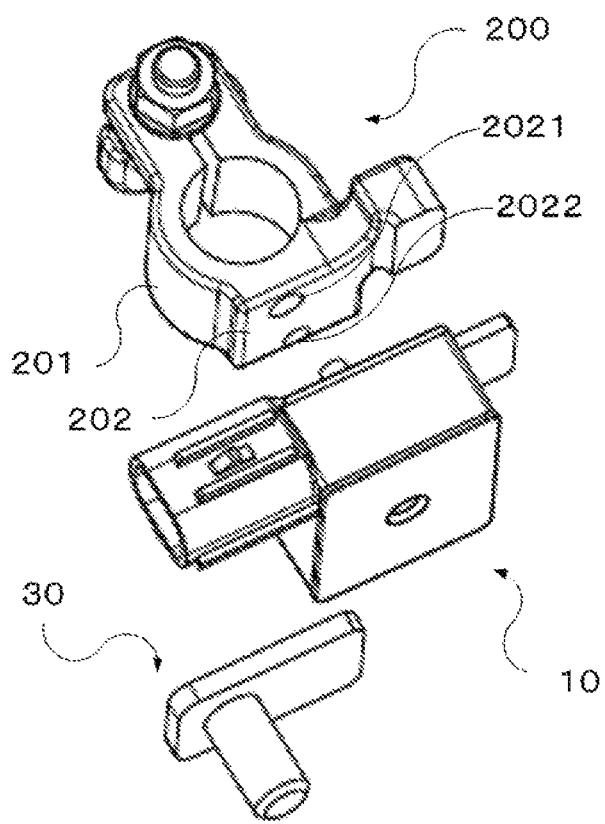
FIG. 13 is an exploded perspective view showing the structure of the battery sensor device in the second attachment mode when the sensor unit attachment part is formed in the axial direction of the clamp.

FIG. 13 is an exploded perspective view illustrating a structure of the battery sensor device in the second attachment mode in a relation rotated by 180° in the plane, with respect to the first attachment mode in FIG. 12.

Accordingly, only the direction of sensor unit 10 can be reversed even when sensor unit attachment part 202 (attachment plane for sensor unit 10) is horizontally formed with respect to the axial direction of clamp 201. The aforementioned effect can thus be achieved.

The disclosed exemplary embodiment is illustrative and not restrictive. The scope of the disclosure indicated by the appended claims and all variations and equivalents that come within the meaning of the claims are intended to be embraced therein.

The battery sensor device of the present disclosure is typically applicable to batteries installed in vehicles.

What is claimed is:

1. A battery sensor device configured to detect a state of a battery supplying power to a load, the battery sensor device comprising:
    a sensor unit including an output end and a bus bar having a resistor and disposed in a power supply path from the battery;
    a sensor substrate configured to detect current flowing through the resistor; and
    a battery terminal unit configured to electrically couple the bus bar and the battery,
    wherein the output end is configured to externally output a signal based on the current detected by the sensor substrate,
    the sensor unit is separate from the battery terminal unit, and has a structure capable of being fixed onto the battery terminal unit in a first attachment mode and a second attachment mode in which a position of the sensor unit is reversed in a plane,
    the bus bar has a first end and a second end that are point-symmetrical with respect to a symmetric point in the plane,
    the sensor unit includes a casing having a rectangular shape in a planar view, the casing including a cavity in which the sensor substrate is accommodated,
    the first end of the bus bar and the output end protrude from a first side wall of the casing, the first end being a lengthwise end of the bus bar, and
    the second end of the bus bar protrudes from a second side wall on a reverse side of the casino from the first side wall, the second end being another lengthwise end of the bus bar.

2. The battery sensor device according to claim 1,
    wherein the battery terminal unit includes a clamp to be connected to a terminal of the battery, and a sensor unit attachment part integrated with the clamp and attached to the sensor unit,
    the clamp is disposed adjacent to the sensor unit, and
    the output end is disposed at a position that does not interfere with the clamp in the first and second attachment modes.

3. The battery sensor device according to claim 1,
    wherein the first end and the second end are disposed on different sides with respect to a center line dividing the casing into two parts, the center line being parallel to a third side wall of the casing other than the first side wall and the second side wall.

4. The battery sensor device according to claim 3,
    wherein the output end is disposed inside a quadrilateral including the first end and the second end as diagonal vertexes in a planar view.

5. The battery sensor device according to claim 3,
    wherein the bus bar has a linear shape.

6. The battery sensor device according to claim 3,
wherein the bus bar has a cranked shape.

7. The battery sensor device according to claim 3,
wherein the battery terminal unit includes a clamp to be connected to a terminal of the battery, and a sensor unit attachment part integrated with the clamp and attached to the sensor unit,
the clamp is disposed adjacent to the third side wall, and
the sensor unit attachment part has an L-shape extending outward than the first side wall or the second side wall, and is bonded to the first end or the second end.

8. The battery sensor device according to claim 7,
wherein the sensor unit attachment part is provided with fixing holes for securing the sensor unit,
the casing has fixing bosses that engages with the sensor unit attachment part at the fixing holes, respectively, and
the fixing holes are point-symmetrical with respect to the symmetric point in the plane, and the fixing bosses are point-symmetrical with respect to the symmetric point in the plane.

9. The battery sensor device according to claim 8,
wherein the sensor unit attachment part is further provided with a fixing hole for securing the sensor unit at the symmetric point, and
the casing further has a fixing boss that engages with the sensor unit attachment part at the fixing hole at the symmetric point.

10. The battery sensor device according to claim 7,
wherein the sensor unit attachment part is provided with a fixing hole for securing the sensor unit at the symmetric point, and
the casing has a fixing boss that engages with the sensor unit attachment part at the fixing hole.

11. The battery sensor device according to claim 1,
wherein the bus bar includes a first current-detecting pin and a second current-detecting pin,
the sensor substrate includes a first current-detecting input part connected to the first current-detecting pin or the second current-detecting pin, a second current-detecting input part connected to the second current-detecting pin or the first current-detecting pin, and two external output parts connected to the output end, and
the two external output parts are point symmetrical with respect to a midpoint of a line segment connecting the first current-detecting input part and the second current-detecting input part in the plane.

12. The battery sensor device according to claim 1,
wherein the sensor unit includes a thermistor configured to detect an ambient temperature of the bus bar.

13. The battery sensor device according to claim 1, further comprising a load terminal unit configured to electrically couple the bus bar and the load,
wherein the load terminal unit is separate from the sensor unit and the battery terminal unit.

14. A battery sensor device configured to detect a state of a battery supplying power to a load, the battery sensor device comprising:
a sensor unit including an output end and a bus bar having a resistor and disposed in a power supply path from the battery;
a sensor substrate configured to detect current flowing through the resistor; and
a battery terminal unit configured to electrically couple the bus bar and the battery,
wherein the output end is configured to externally output a signal based on the current detected by the sensor substrate,
the sensor unit is separate from the battery terminal unit, and has a structure capable of being fixed onto the battery terminal unit in a first attachment mode and a second attachment mode in which a position of the sensor unit is reversed in a plane,
the battery terminal unit includes a clamp to be connected to a terminal of the battery, and a sensor unit attachment part integrated with the clamp and attached to the sensor unit, and
the clamp is disposed adjacent to the sensor unit.

15. The battery sensor device according to claim 14, wherein the output end is disposed at a position that does not interfere with the clamp in the first and second attachment modes.

* * * * *